(12) United States Patent
Bragagna et al.

(10) Patent No.: US 9,194,612 B2
(45) Date of Patent: Nov. 24, 2015

(54) STAND FOR SUPPORTING SOLAR PANELS ON A FLAT ROOF

(71) Applicant: Hilti Aktiengesellschaft, Schaan (LI)

(72) Inventors: Elio Bragagna, Duens (AT); Berndt Trebo, Fussach (AT); Klaus Schwerdtfeger, Feldkirch-Gisingen (AT); Gerald Schreiber, Feldkirch (AT)

(73) Assignee: Hilti Aktiengesellschaft, Schaan (LI)

( * ) Notice: Subject to any disclaimer, the term of this patent is extended or adjusted under 35 U.S.C. 154(b) by 0 days.

(21) Appl. No.: 14/298,660

(22) Filed: Jun. 6, 2014

(65) Prior Publication Data

US 2014/0366465 A1 Dec. 18, 2014

(30) Foreign Application Priority Data

Jun. 12, 2013 (EP) ..................................... 13171662

(51) Int. Cl.
| | |
|---|---|
| *F24J 2/52* | (2006.01) |
| *H02S 20/00* | (2014.01) |
| *H01L 31/042* | (2014.01) |
| *H01L 31/048* | (2014.01) |
| *H02S 20/24* | (2014.01) |

(52) U.S. Cl.
CPC .............. *F24J 2/5245* (2013.01); *F24J 2/5233* (2013.01); *F24J 2/5239* (2013.01); *H01L 31/0422* (2013.01); *H01L 31/0484* (2013.01); *H02S 20/00* (2013.01); *H02S 20/24* (2014.12); *Y02B 10/20* (2013.01); *Y02E 10/47* (2013.01)

(58) Field of Classification Search
CPC ....... F24J 2/5245; F24J 2/5233; F24J 2/5239; H02S 20/24; H02S 20/00; H01L 31/0484; H01L 31/0422; Y02B 10/20; Y02E 10/47
USPC ............. 52/173.3, 200, 202, 204.5, 210, 212, 52/204.54
See application file for complete search history.

(56) References Cited

U.S. PATENT DOCUMENTS

| | | | | | |
|---|---|---|---|---|---|
| 5,678,383 | A | * | 10/1997 | Danielewicz ................... | 52/775 |
| 6,370,828 | B1 | * | 4/2002 | Genschorek .................... | 52/200 |
| 7,592,537 | B1 | * | 9/2009 | West .............................. | 136/251 |
| 8,381,465 | B2 | * | 2/2013 | Brescia et al. ................ | 52/173.3 |
| 8,567,134 | B1 | * | 10/2013 | Grushkowitz et al. ........ | 52/173.3 |
| 8,720,131 | B2 | * | 5/2014 | Urban et al. .................. | 52/173.3 |
| 8,793,941 | B2 | * | 8/2014 | Bosler et al. ................. | 52/173.3 |
| 2003/0101662 | A1 | * | 6/2003 | Ullman ............................ | 52/27 |
| 2014/0137489 | A1 | * | 5/2014 | Habdank et al. .............. | 52/173.3 |

FOREIGN PATENT DOCUMENTS

| | | |
|---|---|---|
| DE | 20 2008 007 549 U1 | 10/2008 |
| DE | 20 2010 015 817 U1 | 3/2011 |
| DE | 20 2011 100 947 U1 | 12/2011 |
| DE | 10 2011 007 521 A1 | 10/2012 |
| EP | 2 182 303 A2 | 5/2010 |

(Continued)

*Primary Examiner* — Jeanette E Chapman
(74) *Attorney, Agent, or Firm* — Crowell & Moring LLP

(57) ABSTRACT

A stand for supporting solar panels on a flat roof is disclosed. The stand has a foot part, which has a base plate for support on the flat roof, and a head part, which has a support area for solar panels, wherein the head part and the foot part are two separate parts. The foot part has integral lock bars and the head part has integral lock bars. The lock bars connect the head part and the foot part to one another in a form-fitting manner.

13 Claims, 2 Drawing Sheets

(56) References Cited

FOREIGN PATENT DOCUMENTS

| | | | |
|---|---|---|---|
| EP | 2 362 161 | A1 | 8/2011 |
| EP | 2 416 084 | A2 | 2/2012 |
| EP | 2 525 165 | A1 | 11/2012 |
| EP | 2 525 166 | A1 | 11/2012 |
| WO | WO 2009/120923 | A2 | 10/2009 |
| WO | WO 2009/137809 | A1 | 11/2009 |
| WO | WO 2011/160851 | A1 | 12/2011 |
| WO | WO 2012/012998 | A1 | 2/2012 |
| WO | WO 2012/041827 | A1 | 4/2012 |
| WO | WO 2012/095195 | A2 | 7/2012 |

* cited by examiner

STAND FOR SUPPORTING SOLAR PANELS ON A FLAT ROOF

This application claims the priority of European Patent Document No. EP 13171662.3, filed Jun. 12, 2013, the disclosure of which is expressly incorporated by reference herein.

BACKGROUND AND SUMMARY OF THE INVENTION

The invention relates to a stand for supporting solar panels on a flat roof. Such a stand is designed with a foot part, which has a base plate for resting on the flat roof, and a head part, which has a supporting region for solar panels, wherein the head part and the foot part are two separate parts.

A generic stand is disclosed in EP 2416084 A2, which describes a mounting base, which is embodied as a cast part standing on a sliding shoe.

Another solar array with supporting elements is known from WO 12012998 A1. This document teaches that multipart supporting elements may be connected by means of additional elements. The additional elements may be groove bricks, for example.

Additional supporting elements for solar arrays are known from DE 202008007549 U1, WO 11160851 A1, EP 2525165 A1, EP 2525166 A1, DE 102011007521 A1, WO 12095195 A2, DE 202010015817 U1, WO 09120923 A2 and WO 12041827 A1.

The object of the invention is to provide a stand for solar arrays, which is particularly simple to install with a particularly low cost of materials and cost of production and is reliable in operation.

A stand according to the invention is characterized in that the foot part has integral lock bars and the head part has integral lock bars, such that the lock bars join the head part and the foot part together in a form-fitting manner.

According to the invention, it is thus provided that in the case of a multipart stand for solar arrays, the head part, which is separate from the foot part, is to be joined together by means of lock bars, which mutually engage in one another in a form-fitting manner and thus form a type of gear teeth, wherein the lock bars are designed to be integral, i.e., in one piece with their respective part. The lock bars of the head part are thus designed in one piece with the head part, and the lock bars of the foot part are designed in one piece with the foot part. The lock bars of the foot part in particular are designed in one piece with the base plate, and/or the lock bars of the head part are designed in one piece with the supporting region. The integral embodiment of the lock bars makes it possible to manufacture the two parts of the stand, including the elements provided for connecting the parts, by a strand casting method, which is thus especially simple and inexpensive. In addition, because of their integral design, the lock bars are correctly positioned from the beginning. Therefore, no complex positioning, such as that required for separate bar elements under some circumstances, is necessary during installation according to the invention. At the same time, the cost of materials may be especially low in the multipart embodiment of the stand.

The lock bars can secure the head part on the foot part in a form-fitting manner. In particular they can secure the head part to prevent it from moving at a right angle to the base plate, away from the foot part and/or toward the foot part. The lock bars are preferably designed to be continuous but may fundamentally also be interrupted in some locations. The lock bars suitably run parallel to one another. It is possible in particular to provide that the lock bars of the foot part extend through the foot part and/or that the lock bars of the head part extend through the entire head part. The positive fit between the lock bars may be formed on the rear cut surfaces, which are formed on the lock bars.

The solar panels may be photovoltaic panels in particular. The solar panels are preferably supported by the stand in an angular position to the horizontal, in particular with an inclination toward the western direction or the eastern direction. The stands can support at least one solar panel. A stand according to the invention will preferably support four solar panels, i.e., four panels sit on the supporting area. The base plate may rest directly or indirectly on the flat roof. For example, a protective mat, a nonwoven or some other protective layer or separating layer may also be provided between the base plate and the flat roof. Likewise, the solar panels may sit on the supporting area indirectly but preferably directly.

As already explained above, it is particularly advantageous that the head part and/or the foot part is/are designed as extruded parts. Such extruded parts usually have an essentially constant cross-section in the longitudinal direction due to the production process, with the exception of recesses produced subsequently.

It is especially preferable for the head part and the foot part to be joined to one another by means of a snap connection, which is formed by lock bars. A snap connection may be understood as usual to mean a connection, which is equipped so that the head part and/or the foot part undergo(es) elastic deformation in joining, and the two parts then become interlocked. A snap connection permits a particularly simple on-site installation. A twist-snap connection may be provided in particular, snapping into position when the head part is twisted relative to the foot part, in particular about the longitudinal axis of the stand. A pivot joint may be formed here between the head part and the foot part.

Another embodiment variant lies in the fact that a lock bar of the one part is accommodated between two lock bars of the other part. This provides a particularly reliable locking connection even in opposite directions. Furthermore, the aforementioned pivot joint may be formed through this configuration. Two lock bars of one part are preferably accommodated between two lock bars of the other part. The term "parts" is understood here to refer to the head part and/or the foot part.

It is especially expedient that the head part has a first web and a second web and/or that the foot part has a first web and a second web. Each of the webs preferably has at least one lock bar. The webs allow a particularly simple positioning, which also is particularly advantageous for the force flow. The webs of the foot part preferably protrude away from the foot part on the outside, and/or the webs of the head part preferably protrude away from the head part on the outside. The webs of the foot part may in particular each have one of the lock bars, and the webs of the head part may each have two of the lock bars.

It may be preferable for the lock bars of the foot part to be facing one another and/or for the webs of the head part to mesh between the webs of the foot part. This permits a particularly simple and reliable installation of the head part on the foot part, which stands on the roof.

Another advantageous embodiment is based on the fact that the head part has a tubular body. This may be advantageous in particular with regard to the application of force, and the tubular body may also serve to accommodate ballast elements. The longitudinal axis of the tubular body preferably extends in the longitudinal direction of the head part, i.e., in particular parallel to the lock bars of the head part.

The webs of the head part on one side and the supporting area for solar panels on the other side are suitably disposed on opposite sides of the head part. It is possible in particular to provide that the supporting area for solar panels is situated on the tubular body on one side, and the two webs of the head part are disposed on the other side. This makes it possible to obtain a particularly compact design that is easy to install.

Preferably at least one ballast element may be disposed in the interior of the tubular body. In this case, the head part may also serve to provide positioning and securing of the ballast, which may be provided, for example, to increase the stability of solar arrays that do not pass through the roof.

Another preferred embodiment of the invention lies in the fact that a channel, in particular a screw channel, is provided on the foot part, and a screw is screwed through the head part into the channel. This provides an additional connection between the head part and the foot part in a particularly simple way, in particular in comparison with a displacement in the longitudinal direction of the stand. The foot part may preferably be locked onto the head part with the channel in the case of an even tighter connection.

For a particularly good positionability in installation and/or for particularly good stability, for example, it is possible to provide that the stand is connected to an additional stand by means of at least one strut. The additional stand may also be embodied as described in this patent application. The strut is preferably attached to the head part of the stand and/or the additional stand, which can prevent excessive load on the connection between the head part and the foot part. The invention also relates to a solar array having a plurality of stands according to the invention, wherein the foot parts of all the stands of the solar array are separate parts. Accordingly, the foot parts are thus not formed by a continuous rail but instead are formed by separate parts.

The foot part of the stand is preferably longer than the head part, as seen in the longitudinal direction of the stand. This achieves a particularly high stability with a particularly low cost of materials. The "longitudinal direction" may be understood in particular to be the direction in which the lock bars run and/or the direction in which the stand essentially has a constant cross section. Furthermore, the foot part of the stand may also be wider than the head part, as seen in the transverse direction of the stand, in particular parallel to the base plate.

The invention makes it possible to adapt solar arrays to the local conditions in a particularly simple manner. Thus, by simply varying the length of the foot parts, it is possible to take into account the fact that different types of roof insulation will have different compressive strength values. By varying the length of the foot parts, it is possible to implement the locally required contact area for transfer of the compressive loads due to snow, for example, wherein the length of the head parts may preferably remain constant. This permits significant cost savings and material savings.

Accordingly, the invention also relates to an array consisting of a first solar array and a second solar array, wherein the first solar array and the second solar array are provided on different flat roofs, wherein the two solar arrays each have stands, preferably with one or more features from the text of the present patent application, for supporting solar panels on the respective flat roof, wherein the stands each consist of a head part and a foot part, wherein the head parts of the first solar array have the same dimensions, in particular the same length, as the head parts of the second solar array, and wherein the foot parts of the first solar array have different dimensions, in particular different lengths, than the foot parts of the second solar array. The foot parts of one and the same array preferably all have the same dimensions, which simplifies the installation.

The invention is explained in greater detail below with reference to preferred exemplary embodiments, which are depicted schematically in the accompanying drawings, where individual features of the exemplary embodiments presented below can be implemented essentially either individually or in any combination within the scope of the present invention.

DETAILED DESCRIPTION OF THE DRAWINGS

Figure 1:
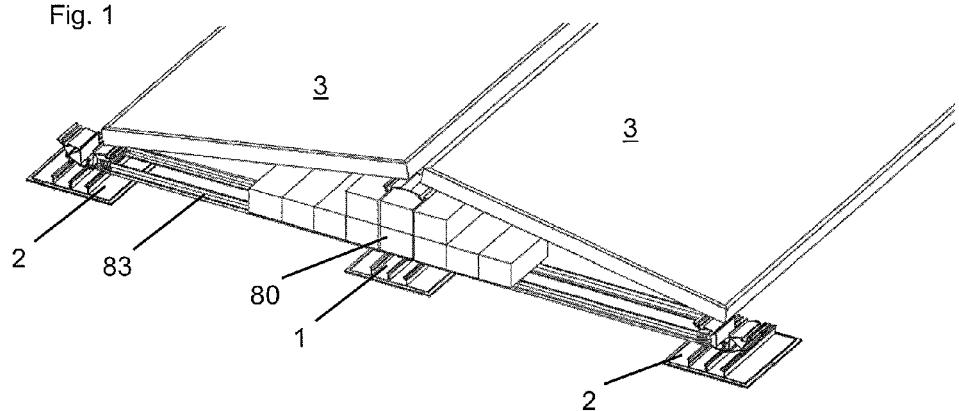
FIG. 1 illustrates a solar module array having stands according to the present invention.

FIG. 1 shows a solar module array having high stand 1 and low stand 2 in alternating sequence. Neighboring stands 1, 2 are connected by struts 83. Solar panels 3 sit on the stands 1, 2, wherein the solar panels 3 are disposed in an inverted V shape because of the alternating sequence of low stand 2 and high stand 1.

Figure 2:
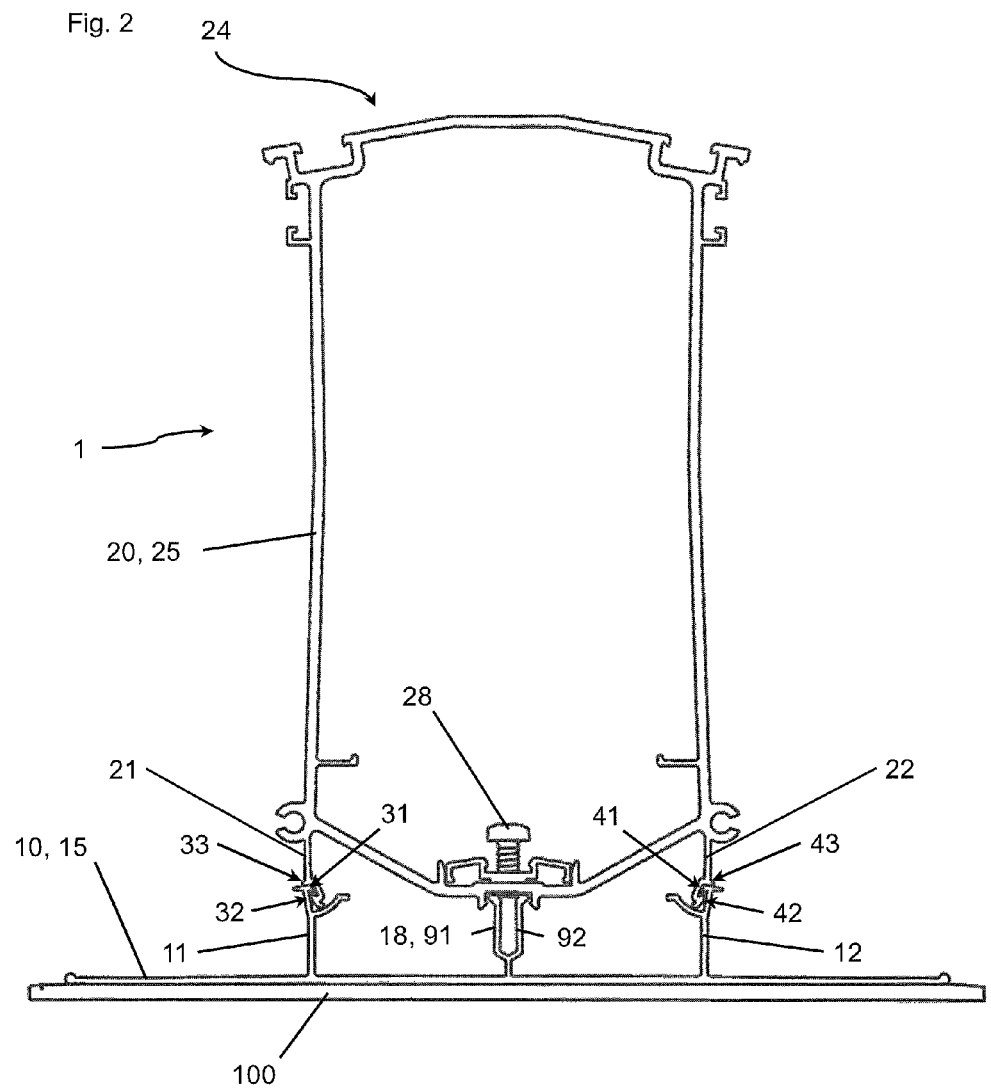
FIG. 2 is a cross-sectional view of a high stand from FIG. 1 in an assembled state.
Figure 3:
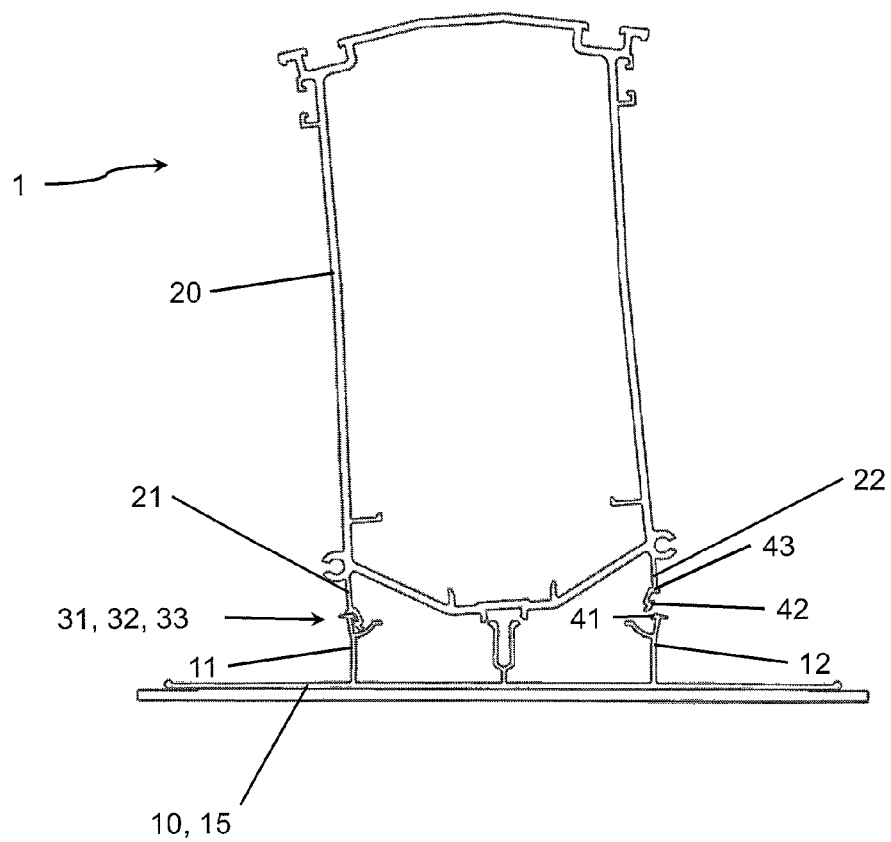
FIG. 3 is a cross-sectional view of the stand from FIG. 2 during assembly.

One high stand 1 is shown in detail in FIGS. 2 and 3. The stand 1 has a foot part 10 for sitting on a roof as well as a head part 20 on which the solar panels 3 are placed.

The foot part 10 has a planar base plate 15 with two webs 11 and 12, from which they protrude upward. The head part 20 has a tubular body 25 on the top side of which a support area 24 for solar panels 3 is formed, and on the bottom side of which two webs 21 and 22 protrude downward. Two securing channels are also provided on the support area 24; module clamps can be introduced into them for securing the solar panels 3. As shown in FIG. 1, one or more block-shaped ballast elements 80 made of concrete, for example, may be accommodated in the interior of the tubular body 25. The head part 20 and/or the foot part 10 is/are preferably designed in mirror symmetry.

The left web 11 of the foot part 10 has a lock bar 31, which protrudes toward the right, from the left web 11 to the right web 12 of the foot part 10. Similarly, the right web 12 of the foot part 10 has a lock bar 41, which protrudes toward the left, from the right web 12 to the left web 11.

The left web 21 of the head part 20 has two lock bars 32 and 33 running one above the other, at a distance apart from one another, protruding on the side of the left web 21 facing away from the right web 22. Similarly, the right web 22 of the head part 20 has two lock bars 42 and 43 running one above the other, at a distance apart from one another, protruding on the side of the right web 22 facing away from the left web 21.

In the assembled state of the stand 1, which is shown in FIG. 2, the left lock bar 31 of the foot part 10 is accommodated between the two left lock bars 32 and 33 of the head part 20, and the right lock bar 41 of the foot part 10 is accommodated between the two right lock bars 42 and 43 of the head part 20. Due to the lock bars thus intermeshed, the head part 20 and the foot part 10 are joined together in a form-fitting manner. All the lock bars 31, 32, 33, 41, 42 and 43 preferably run parallel to one another.

FIG. 3 shows the stand 1 from FIG. 2 in assembly. As shown in FIG. 3, the two left webs 11 and 21 may form a pivot joint in the area of their lock bars 31 and/or 32 and 33. The head part 20 can be pivoted about this pivot joint, relative to the foot part 10, until the right lock bar 41 of the foot part 10 snaps into position between the two right lock bars 42 and 43 of the head part 20 with deformation of the upper right web 22 and/or the lower right web 12. The lock bars 31, 32, 33, 41, 42 and 43 thus form a twist-snap closure. Similarly, the two right webs 12 and 22 (not shown separately) may also form a pivot joint in the area of their lock bars 41 and/or 42 and 43, about which the head part 20 can be pivoted relative to the foot part 10 until the left lock bar 31 of the foot part 10 snaps into position between the two left lock bars 32 and 33 of the head part 20.

A channel 18, preferably embodied as a screw channel 18, is provided on the foot part 10, preferably on the base plate 15 of the foot part 10. In the assembled state of the stand 1, which is shown in FIG. 2, a screw 28, which is preferably designed as a head screw, is screwed through a recess in the head part 20 into the channel 18 so that the head part 20 is additionally secured on the foot part 10, in particular also being secured with respect to a displacement parallel to the lock bars 31, 32, 33, 41, 42 and 43, i.e., perpendicular to the plane of the drawing in FIG. 2. As additionally shown in FIG. 2 in particular, the channel 18 has two parallel legs 91 and 92, which, in the assembled state of the stand 1, engage in the head part 20 and in particular lock together with the head part 20, so that there is additional security between the head part 20 and the foot part 10. The screw 28 screwed into the channel 18 can secure the locking of the legs 91 and 92 of the channel 18 and/or can press the legs 91 and 92 outward, pressing them against the head part 20, which can have an additional securing effect.

A protective mat 100, which is disposed on the bottom side of the base plate 15, preferably being glued there, may also be provided on the foot part 10. Additionally, or as an alternative to the protective mat, a nonwoven or some other protective and/or dividing layer, may also be provided.

Figure 4:
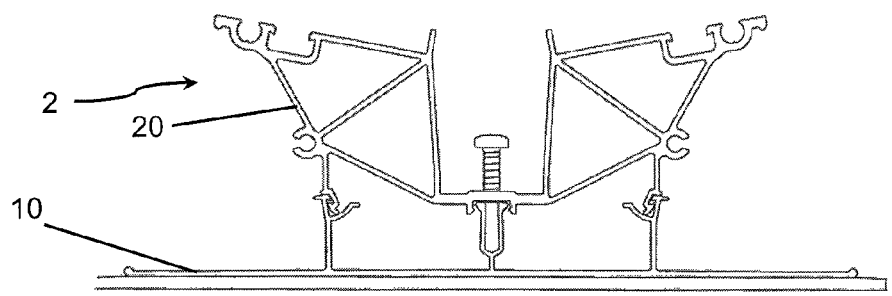
FIG. 4 is a cross-sectional view of a low stand from FIG. 1 in the assembled state.

FIG. 4 shows the low stand 2 from FIG. 1. The foot part 10 of this low stand 2 is designed to be identical to the high stand 1. Only the head part 20 of the low stand 2 is designed to be different from the high stand 1, in particular lower in comparison with the high stand and with a different type of support area for solar panels. However, the lock bars of the low stand 2 are designed to be identical to the high stand 1.

As shown in FIG. 1, the respective foot parts 10 of the stands 1 and 2 are longer than the respective head parts 20, as seen in the longitudinal direction of the respective stand (i.e., from the left front to the right rear in FIG. 1). This achieves a particularly high stability with a particularly low cost of materials. As FIG. 1 also shows, ballast elements 80, which sit on the struts 83 and/or are disposed in the tubular body 25 of the head part 20 of the high stand 1, may be provided.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A stand for supporting a solar panel on a flat roof, comprising:
    a foot part which has a base plate for support on the flat roof; and
    a head part which has a support area for a solar panel, wherein the head part and the foot part are two separate parts;
    wherein the foot part has integral lock bars and the head part has integral lock bars and wherein the respective lock bars connect the head part to the foot part in a form-fitting manner;
    and wherein the support area is on a top side of the head part and the lock bars of the head part are on a bottom side of the head part.

2. The stand according to claim 1, wherein the head part and the foot part are extruded parts.

3. The stand according to claim 1, wherein the head part and the foot part are connected together by the lock bars with a snap connection.

4. The stand according to claim 1, wherein a lock bar of the foot part is accommodated between two lock bars of the head part.

5. The stand according to claim 1, wherein a lock bar of the head part is accommodated between two lock bars of the foot part.

6. The stand according to claim 1, wherein the head part has a first web and a second web, wherein the foot part has a first web and a second web, and wherein each of the webs of the head part and the foot part includes at least one of the respective lock bars.

7. The stand according to claim 1, wherein the lock bars of the foot part face one another.

8. The stand according to claim 6, wherein the head part has a tubular body, wherein the support area for the solar panel is disposed on a first side of the tubular body, and wherein the first and second webs of the head part are disposed on second side of the tubular body.

9. The stand according to claim 8, wherein a ballast element is disposed in an interior of the tubular body.

10. The stand according to claim 1, wherein the foot part includes a channel and wherein a screw is screwable into the channel through a recess defined by the head part.

11. The stand according to claim 1, further comprising a strut attached to the head part wherein the stand is connectable to an adjacent stand via the strut.

12. The stand according to claim 1, wherein the foot part is longer than the head part in a longitudinal direction of the stand.

13. A stand for supporting a solar panel on a flat roof, comprising:
    a foot part which has a base plate for support on the flat roof; and
    a head art which has a support area for a solar panel, wherein the head part and the foot part are two separate parts;
    wherein the foot part has integral lock bars and the head part has integral lock bars and wherein the respective lock bars connect the head part to the foot part in a form-fitting manner;
    and wherein the foot part has a first web with a lock bar and has a second web with a lock bar, wherein the head part has a first web with a first lock bar and a second lock bar and has a second web with a first lock bar and a second lock bar, wherein the lock bar of the first web of the foot part is received within the first and second lock bars of the first web of the head part, and wherein the lock bar of the second web of the foot part is received within the first and second lock bars of the second web of the head part.

* * * * *